(12) United States Patent
Min

(10) Patent No.: US 12,538,646 B2
(45) Date of Patent: Jan. 27, 2026

(54) DISPLAY PANEL AND DISPLAY DEVICE

(71) Applicant: Yungu (Gu'an) Technology Co., Ltd., Hebei (CN)

(72) Inventor: Kyoung Wook Min, Hebei (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 517 days.

(21) Appl. No.: 17/990,816

(22) Filed: Nov. 21, 2022

(65) Prior Publication Data
US 2023/0080648 A1    Mar. 16, 2023

Related U.S. Application Data

(63) Continuation of application No. PCT/CN2021/102936, filed on Jun. 29, 2021.

(30) Foreign Application Priority Data

Sep. 2, 2020 (CN) .......................... 202010909126.6

(51) Int. Cl.
*H10K 50/844* (2023.01)
*H10D 86/40* (2025.01)
(Continued)

(52) U.S. Cl.
CPC .......... *H10K 50/844* (2023.02); *H10D 86/40* (2025.01); *H10D 86/60* (2025.01); *H10K 59/1213* (2023.02); *H10K 59/1216* (2023.02)

(58) Field of Classification Search
CPC ............. H10K 50/844; H10K 59/1213; H10K 59/1216; H10K 59/12; H10K 59/8731;
(Continued)

(56) References Cited

U.S. PATENT DOCUMENTS

2008/0054801 A1    3/2008 Lee et al.
2014/0159031 A1*   6/2014 Aonuma .............. H10K 50/165
                                                           438/46
(Continued)

FOREIGN PATENT DOCUMENTS

CN    107017353 A    8/2017
CN    108389882 A    8/2018
(Continued)

OTHER PUBLICATIONS

International Search Report mailed Sep. 15, 2021, in International Application No. PCT/CN2021/102936, 6 pages.
(Continued)

*Primary Examiner* — Chad M Dicke
*Assistant Examiner* — Gary Abel
(74) *Attorney, Agent, or Firm* — Maier & Maier, PLLC

(57) ABSTRACT

A display panel and a display device. The display panel includes: an array substrate; a light-emitting layer which is provided on the array substrate; and a encapsulation layer which covers the light-emitting layer. The encapsulation layer includes at least one inorganic film layer and at least one organic film layer which are stacked and alternately arranged, and the at least one inorganic film layer includes a first region and a second region arranged around the first region, the first region of the at least one inorganic film layer located between the light-emitting layer and the organic film layer has a surface energy greater than the second region, and the organic film layer is stacked over the first region.

17 Claims, 4 Drawing Sheets

(51) Int. Cl.
*H10D 86/60* (2025.01)
*H10K 59/121* (2023.01)

(58) Field of Classification Search
CPC .... H10K 50/8445; H10K 71/00; H10K 50/80; H10K 50/84; H10K 59/1201; H10K 59/00; H10K 59/70; H10K 59/80–88; H10K 59/873–874; H10D 86/40; H10D 86/60
See application file for complete search history.

(56) References Cited

U.S. PATENT DOCUMENTS

| | | | | |
|---|---|---|---|---|
| 2015/0214374 | A1* | 7/2015 | Hara | H10D 64/62 |
| | | | | 257/43 |
| 2016/0049615 | A1* | 2/2016 | Kim | H10K 59/122 |
| | | | | 257/40 |
| 2017/0125732 | A1* | 5/2017 | Lee | H10K 59/8731 |
| 2018/0331326 | A1* | 11/2018 | Woo | H10K 59/879 |
| 2021/0066655 | A1* | 3/2021 | Jiang | H10K 50/844 |
| 2023/0180584 | A1* | 6/2023 | Li | G06F 3/04164 |
| | | | | 345/174 |

FOREIGN PATENT DOCUMENTS

| | | | | |
|---|---|---|---|---|
| CN | 109950421 | A | * | 6/2019 |
| CN | 110518043 | A | | 11/2019 |
| CN | 110581229 | A | | 12/2019 |
| CN | 110707236 | A | | 1/2020 |
| CN | 109546004 | B | | 6/2020 |
| CN | 111834551 | A | | 10/2020 |
| JP | 2005249881 | A | * | 9/2005 |
| JP | 2009092766 | A | * | 4/2009 |
| KR | 102000034 | B1 | * | 7/2019 ............... G03F 7/16 |

OTHER PUBLICATIONS

Office Action mailed Nov. 3, 2021, in Chinese Application No. 202010909126.6, 12 pages.
Rejection Decision mailed Jun. 6, 2022, in Chinese Application No. 202010909126.6, 5 pages.

* cited by examiner

DISPLAY PANEL AND DISPLAY DEVICE

CROSS REFERENCE TO RELATED APPLICATION

This application is a continuation of International Application No. PCT/CN2021/102936, filed on Jun. 29, 2021, which claims priority to the Chinese Patent Application No. 202010909126.6, filed on Sep. 2, 2020, both of which are incorporated herein by reference in their entireties.

TECHNICAL FIELD

The present application relates to the technical field of display, and particularly to a display panel and display device.

BACKGROUND

In recent years, Organic Light Emitting Diode (OLED) display technology has developed rapidly. OLED products have received more and more attention and applications due to their advantages of thinness, fast response, wide viewing angle, high contrast, and bendability, and are mainly used in display technology fields such as mobile phones, tablets, and TVs. The existing OLED encapsulation technology is prone to encapsulation failure, which negatively affects the service life of display panel.

SUMMARY

Embodiments of the present application provide a display panel and a display device, which display panel is safely packaged to ensure its service life.

In one aspect, a display panel according to embodiments of the present application is provided, comprising: an array substrate; a light-emitting layer that is arranged on the array substrate; a encapsulation layer covering the light-emitting layer, wherein the encapsulation layer comprises at least one inorganic film layer and at least one organic film layer which are stacked and alternately arranged, the at least one inorganic film layer includes a first region and a second region arranged around the first region, the first region of the at least one inorganic film layer located between the light-emitting layer and the organic film layer has a surface energy greater than the second region, and the organic film layer is stacked over the first region.

In another aspect, a display device according to embodiments of the present application is provided, including the above-mentioned display panel.

According to the display panel and the display device provided by embodiments of the present application, the display panel comprises an array substrate, a light-emitting layer and a encapsulation layer, the light-emitting layer is arranged on the array substrate, and the encapsulation layer is arranged to cover the light-emitting layer and protect the light-emitting layer. The light-emitting layer includes at least one inorganic film layer and at least one organic film layer that are stacked and alternately arranged. The first region of the at least one inorganic film layer located between the light-emitting layer and the organic film layers has a surface energy greater than the second region, so that liquid used for forming an organic film layer can be trapped in the first region to prevent the liquid from overflowing to the second peripheral region, when the organic film layer is molded, thereby ensuring the encapsulation safety and service life of the display panel.

DETAILED DESCRIPTION

Features and exemplary embodiments of various aspects of the present application will be described in details below. In order to make the objects, technical solutions and advantages of the present application clearer, the present application is further described in details below with reference to the accompany drawings and specific embodiments.

In the field of display technology, such as OLED display technology, in order to ensure the safety performance of a light-emitting layer of a display panel, a encapsulation layer, such as a thin-film encapsulation layer, is arranged on the light-emitting layer to prevent water vapor from entering the light-emitting layer and affecting service life of the display panel. With the development of display technology, in order to realize a narrow frame, it is required that the edge of peripheral regions of a display panel should be as narrow as possible. The existing display panel has a encapsulation structure that is usually a structure of stacking a plurality of inorganic film layers and a plurality of organic film layers, wherein the organic film layer is mainly molded by inkjet printing. Because of the structural limitation of the inorganic film layer included in a encapsulation layer, ink is easy to overflow during the molding of the organic film layer, which is difficult to control and is likely to cause encapsulation failure and affect service life of display panel. In order to control overflow of ink, a barrier wall is arranged in the display panel. Nevertheless, the barrier wall has limited ability to control overflow of ink, and negatively affects the narrow frame design of display panel.

Based on the above problems, embodiments of the present application provide a display panel, a display device, and a process for molding the display panel, so that the display panel can be safely packaged, thereby ensuring service life of display panel and facilitating a narrow frame design of display panel.

In order to understand the present application, the display panel, the display device, and the process for molding the display panel according to embodiments of the present application will be described in detail below with reference to FIGS. 1 to 10.

Figure 1:
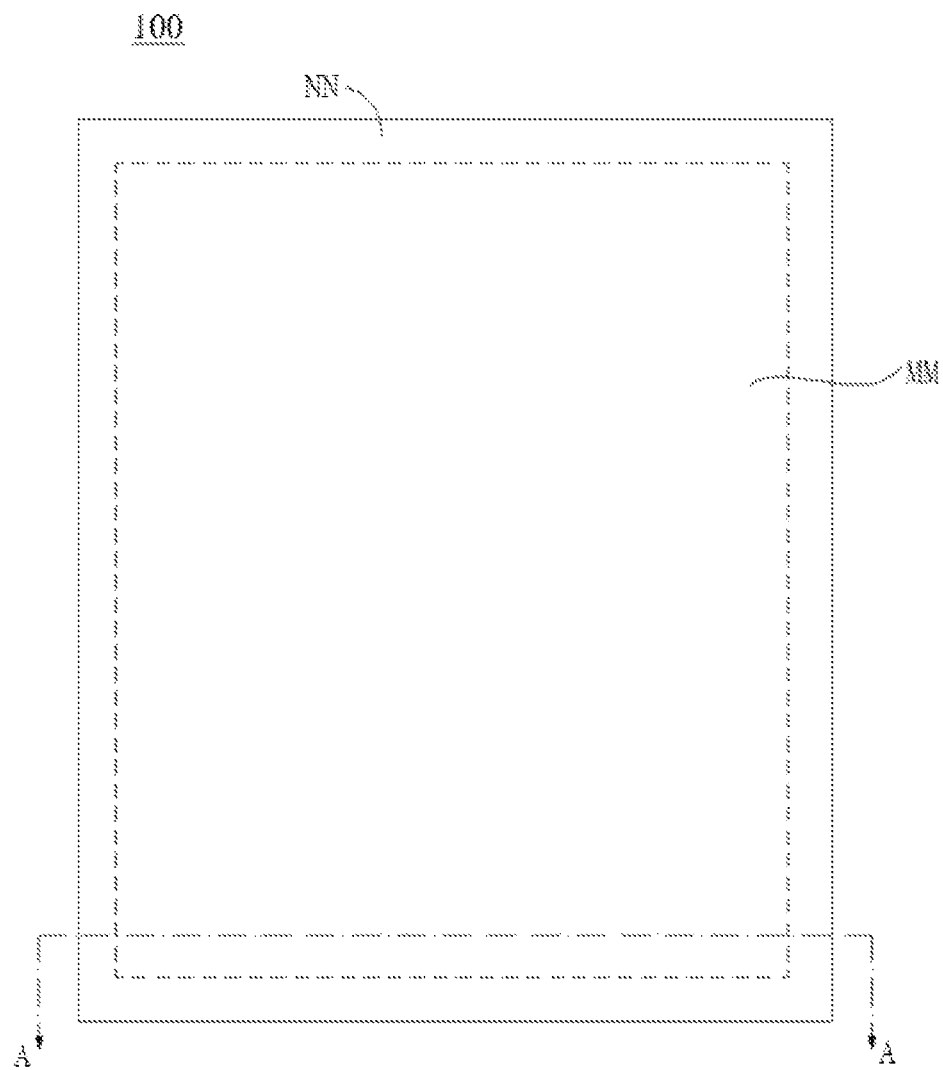
FIG. 1 is a top view of a display panel according to an embodiment of the present application.
Figure 2:
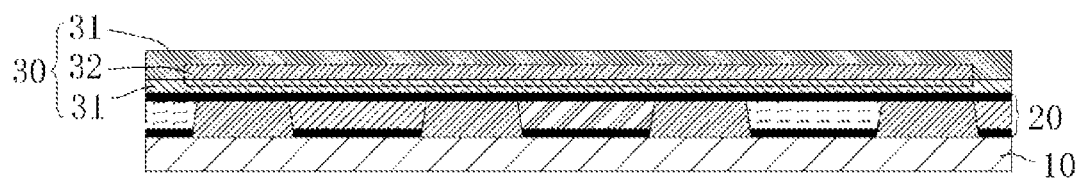
FIG. 2 is a cross-sectional view along the A-A direction of FIG. 1.

As shown in FIG. 1 and FIG. 2, a display panel 100 provided by an embodiment of the present application includes an array substrate 10, a light-emitting layer 20 disposed on the array substrate 10, and a encapsulation layer 30 covering the light-emitting layer 20. The encapsulation layer 30 includes at least one inorganic film layer 31 and at least one organic film layer 32 that are stacked alternately, and the at least one inorganic film layer 31 includes a first region MM and a second region NN arranged around the first region MM. The first region MM of the at least one inorganic film layer 31 located between the light-emitting layer 20 and the organic film layer 32 has a surface energy of greater than the second region NN, and the organic film layer 32 is disposed over the first region MM.

In the display panel 100 provided by embodiments of the present application, the at least one inorganic film layer 31 includes a first region MM and a second region NN, and the first region MM of the at least one inorganic film layers 31 located between the light-emitting layer 20 and the organic film layer 32 has a surface energy of greater than the second region NN. When the organic film layer 32 is molded, liquid used for forming an organic film layer can be trapped in the first region MM to prevent the liquid from overflowing to the second peripheral region NN, thereby ensuring encapsulation safety and service life of the display panel 100. A barrier wall disposed on periphery of the inorganic film layers 31 can be eliminated, which is beneficial to a narrow frame design of the display panel 100.

Optionally, the array substrate 10 may include a plurality of pixel circuits, and the plurality of pixel circuits may be distributed in an array. Optionally, the pixel circuit may be given in a 2T1C circuit, a 3T1C circuit, a 7T1C circuit, a 9T1C circuit, or a 11T1C circuit, or the like.

Among them, "2T1C circuit" refers to a pixel circuit that includes 2 thin film transistors (T) and 1 capacitor (C) in the pixel circuit, and other "3T1C circuit" "7T1C circuit", "9T1C circuit", "11T1C circuit" are in a similar manner.

Optionally, the light-emitting layer 20 is stacked on the array substrate 10. The light-emitting layer 20 includes a plurality of sub-pixels distributed in an array, and each sub-pixel is connected to one pixel circuit on the array substrate 10 to drive the sub-pixel. Each pixel circuit can drive only one sub-pixel. Of course, in some optional examples, each pixel circuit can also drive more than two sub-pixels, and the more than two driven sub-pixels optionally have the same color.

Optionally, the first region MM of each of inorganic film layers 31 located between the light-emitting layer 20 and the organic film layer 32 has a surface energy greater than the second region NN, so that it is not necessary to provide a barrier wall or similar structure for the display panel 100 to control liquid for forming the organic film layer 32, thereby achieving a narrow frame design of display panel 100 while ensuring the encapsulation requirements of display panel 100.

Optionally, the number of the inorganic film layer 31 and the organic film layer 32 included in the encapsulation layer 30 can be set according to encapsulation requirements. In order to understand the display panel 100 provided by embodiments of the present application, the encapsulation layer 30 including two inorganic film layers 31 and one organic film layer 32 is illustrated as an example below.

Optionally, the encapsulation layer 30 includes two inorganic film layers 31 and one organic film layer 32, and the one organic film layer 32 is located between the two inorganic film layers 31. That inorganic film layers 31 disposed near the light-emitting layer 20 include a first region MM and a second region NN disposed around the first region MM, the first region MM of one of the two inorganic film layers 31 located close to the light-emitting layer has surface energy greater than the second region NN and the organic film layer 32 is stacked over the first region MM. When the encapsulation layer 30 is molded, an inorganic film layer 31 disposed near the light-emitting layer 20 is molded first, and then an organic film layer 32 and another inorganic film layer 31 are molded. Through the above arrangement, when the organic film layer 32 is molded, the boundary of liquid for forming the organic film layer 32 is controlled through the second region NN, so that the molded organic film layer 32 is located in the first region MM.

As an optional embodiment, in the display panel 100 provided by embodiments of the present application, the surface of the first region MM away from the array substrate 10 has a contact angle smaller than the surface of the second region NN away from the array substrate 10. Through the above arrangement, the surface energy requirements of the first region MM and the second region NN of the inorganic film layer 31 are better achieved, which is beneficial to controlling the organic film layer 32 within the predetermined first region MM.

In some optional embodiments, the surface of the first region MM away from the array substrate 10 has a contact angle of less than 15°, and the surface of the second region NN away from the array substrate 10 has a contact angle of greater than 40°. Through the above arrangement, the limitation of the first region MM on the liquid boundary when the organic film layer 32 is molded is satisfied, which is beneficial to formation of the inorganic film layer 31.

Optionally, the surface of the first region MM away from the array substrate 10 has a contact angle of less than 10°, and the surface of the second region NN away from the array substrate 10 has a contact angle of greater than 45°. The surface energy of the first region MM is raised to almost the same level as that of the organic film layer 32, and diffusivity of the organic film layer 32 in the first region MM is improved during molding, so that liquid for forming the organic film layer 32 is easy to spread, which is conducive to formation of the organic film layer 32.

Embodiments of the present application provide a display panel 100, in which the surface of the first region MM away from the array substrate 10 has an oxygen content of greater than the surface of the second region NN away from the array substrate 10. Through the above arrangement, the first region MM and the second region NN of the inorganic film layer 31 can be made to satisfy their respective surface energy requirements. For example, the first region MM can be subjected to an oxygen plasma treatment to increase bonding of hydroxyl groups (—OH) and to increase surface energy of the first region MM, so that surface energy of the first region MM is higher than that of the second region NN, thereby controlling formation of the organic film layer 32 and ensuring encapsulation safety.

Figure 3:
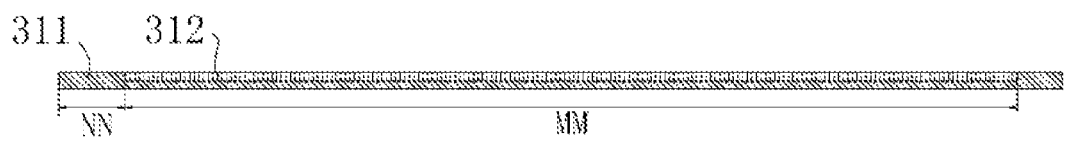
FIG. 3 is a cross-sectional view of an inorganic film layer according to an embodiment of the present application.

As shown in FIG. 1 to FIG. 3, the at least one inorganic film layer 31 of the display panel 100 includes a film body 311 and an energy regulation layer 312 disposed inside or on the film body 311. The energy regulation layer 312 is located in the first region MM, and has a surface energy greater than the film body 311. The inorganic film layer 31 adopts the above-mentioned structural form, which can meet the surface energy requirements of the first region MM and the second region NN of the inorganic film layer 31.

In order to understand the display panel 100 provided by embodiments of the present application, the inorganic film layer 31 disposed near the light-emitting layer 20 includes a film body 311 and an energy regulation layer 312 disposed on the film body 311, and the energy regulation layer 312 is located at the first region MM and has a surface energy greater than the film body 311. Of course, in some embodiments, it is also possible to make each inorganic film layer 31 of the encapsulation layer 30 adopt the above-mentioned form, as long as liquid boundary of organic film layer 32 can be controlled when it is molded, and no specific limitation is made here.

As an optional embodiment, the energy regulation layer 312 may have a thickness that is less than or equal to the film body 311, so that the first region MM and the second region NN of the inorganic film layer 31 may reduce the influence on other film layers of the display panel 100 while meeting the surface energy requirements, which is beneficial to formation of the display panel 100.

As an optional embodiment, the thickness of the energy regulation layer 312 may be any value between 1 nm and 200 nm, including the terminal points 1 nm and 200 nm. The thickness of the energy regulation layer 312 can be any value between 1 nm and 100 nm. In some embodiments, the thickness of the energy regulation layer 312 may be any value between 1 nm and 20 nm, which may be specifically set according to the molding process and molding material of the energy regulation layer 312.

As an optional embodiment, the display panel 100 according to embodiments of the present application is provided so that the energy regulation layer 312 can be embedded into the film body 311, and the energy regulation layer 312 is exposed outside the film body 311 on the side of the film body 311 facing an organic film layer 32. The requirements for surface energy of the first region MM and the second region NN of an inorganic film layer 31 can be met, and the liquid boundary of an organic film layer 32 during molding can be controlled. In addition, the encapsulation layer 30 can be made in a thin thickness, which is beneficial to a light and thin design of display panel 100. When the energy regulation layer 312 is embedded into the film body 311, the thickness of the energy regulation layer 312 can be any value between 1 nm and 20 nm, which can avoid optical changes in the course of surface treatment and avoid adjustment to the structure of other layers, such as the light-emitting layer 20.

Figure 4:
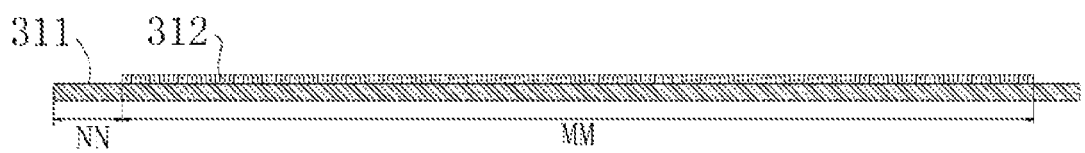
FIG. 4 is a cross-sectional view of an inorganic film layer according to another embodiment of the present application.

The above arrangement of the energy regulation layer 312 and the film body 311 is only an optional embodiment. As shown in FIG. 4, the energy regulation layer 312 is stacked over the film body 311 and at least partially protrudes from the second region NN. Through the above arrangement, the requirements for surface energy of the first region MM and the second region NN of an inorganic film layer 31 can be met. Moreover, the molding process is simple and easy to control. When the energy regulation layer 312 and the film body 311 are in a stacked arrangement, their thickness can be any value between 1 nm and 200 nm.

As an optional embodiment, the energy regulation layer 312 may be made of materials including at least one of silicon oxide SiOx, silicon oxynitride SixOyNz, and aluminum oxide AlxOy. Of course, a combination of two or more of the above may also be used as long as it is possible to achieve that the first region MM of the inorganic film layer 31 has a surface energy greater than the second region NN.

Figure 5:
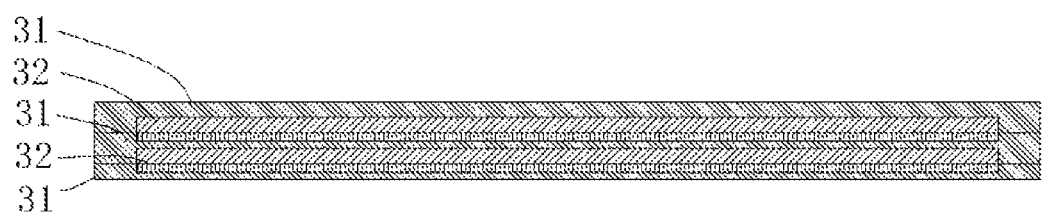
FIG. 5 is a cross-sectional view of an inorganic film layer according to another embodiment of the present application.
Figure 6:
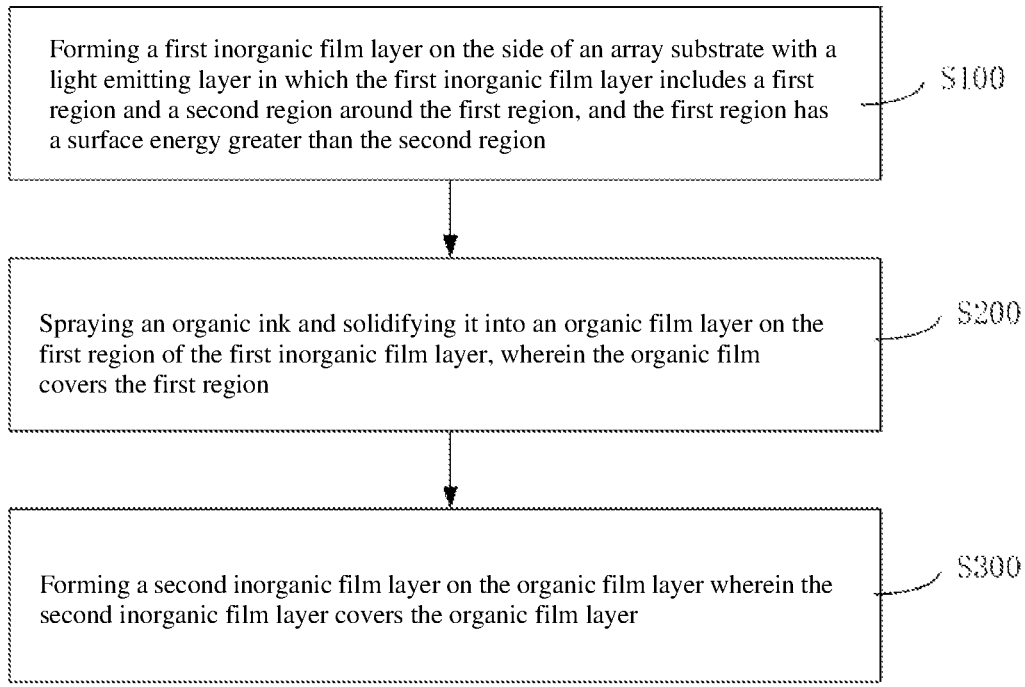
FIG. 6 is a schematic flowchart of a process for forming a display panel according to an embodiment of the present application.

Each of the above-mentioned embodiments is described by taking an example that the encapsulation layer 30 includes two inorganic film layers 31 and one organic film layer 32. As shown in FIG. 5, in some embodiments, more than two inorganic film layers 31 may be included in the encapsulation layer 30, such as three inorganic film layers 31, four inorganic film layers 31, and the like. Meanwhile, there may have more than one organic film layers 32, such as two organic film layers 32, three organic film layers 32, and the like. When the number of the inorganic film layers 31 is more than two, for example, three, the surface energy of the first region MM of each of the two inorganic film layers 31 close to the light-emitting layer 20 can be respectively greater than the surface energy of the respective second region NN, so that it is possible to control liquid boundary of the two organic film layers 32 during molding.

In the display panel 100 provided by an embodiment of the present application, the encapsulation layer 30 includes at least one inorganic film layer 31 and at least one organic film layer 32 that are stacked and alternately arranged, the at least one inorganic film layer 31 includes a first region MM and a second region NN, and the first region MM of the at least one inorganic film layer 31 between the light emitting layer 20 and the organic film layer 32 has a surface energy greater than the second region NN. Therefore, when the organic film layer 32 is molded, liquid used for forming the organic film layer 32 can be trapped in the first region MM to prevent the liquid from overflowing to the second peripheral region, thereby ensuring the encapsulation safety and service life of the display panel 100.

Since the second region NN can control liquid boundary of the organic film layer 32 during molding, it is not required to provide structures such as barrier walls, which can reduce changing width of non-display regions of the display panel 100, and which is beneficial to realize a narrow frame design.

At the same time, the surface energy of the first region MM is greater than the surface energy of the second region NN, which can also improve diffusivity of liquid for forming the organic film layer 32 during it is molding, and which can not only reduce thickness of the organic film layer 32, but also improve its planarization, thereby promoting folding of the display panel 100 and enabling the display panel 100 to have a wide range of applications.

On the other hand, a display device according to embodiments of the present application is provided, including the display panel 100 provided by the above embodiments, and the display device can be any product or component with a display function, such as a mobile phone, a tablet computer, a notebook computer, a digital photo frame, a navigator, and the like. The display device may be integrated with photosensitive components such as a camera. Since the display device provided by embodiments of the present application includes the display panel 100 in any of the above-mentioned embodiments, the display device has the advantages of safe encapsulation, long service life, and a narrow frame.

Figure 7:
FIG. 7 to FIG. 10 are structural views corresponding to each step of a method for forming a display panel according to an embodiment of the present application.
Figure 8:
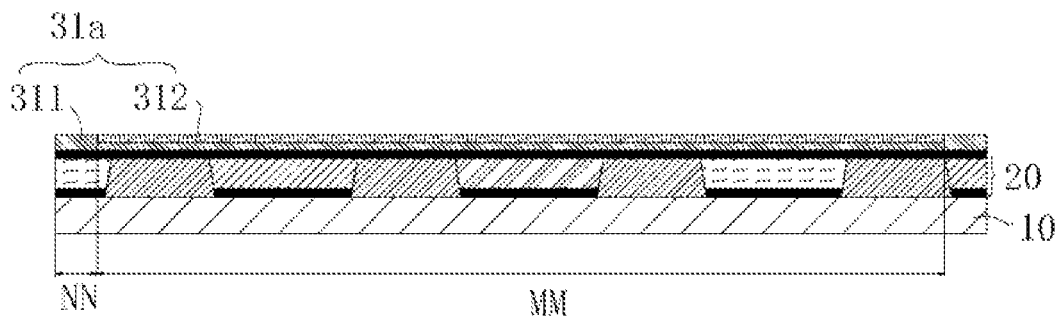

As shown in FIG. 6 to FIG. 10, the molding method of the display panel 100 includes:

S100, as shown in FIG. 7 and FIG. 8, a first inorganic film layer 31a is molded on the side of an array substrate 10 with a light emitting layer 20, in which the first inorganic film layer 31a includes a first region MM and a second region NN around the first region, and the first region MM has a surface energy greater than the second region NN.

Figure 9:
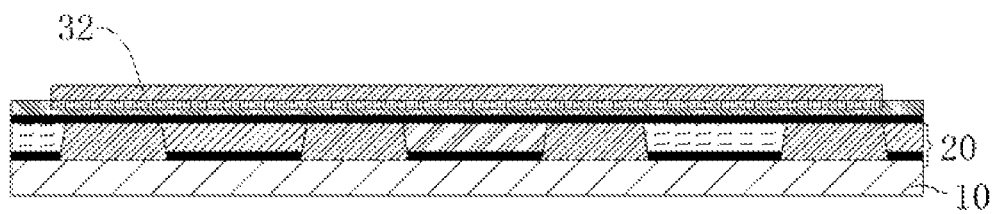

S200, as shown in FIG. 9, an organic ink is sprayed and solidified into an organic film layer 32 on the first region MM of the first inorganic film layer 31a.

Figure 10:
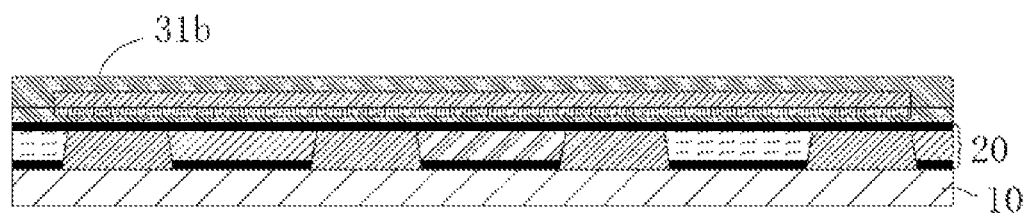

S300, as shown in FIG. 10, a second inorganic film layer 31b is molded on the organic film layer 32, and the second inorganic film layer 31b covers the organic film layer 32.

A process for forming the display panel 100 provided by embodiments of the present application comprises, forming a first inorganic film layer 31a on the side of an array substrate 10 with a light emitting layer 20 so that the first inorganic film layer 31a comprises a first region MM and a second region NN arranged around the first region MM, and the first region MM has a surface energy greater than the second region NN. When an organic film layer 32 of the display panel 100 is molded with ink by inkjet printing, the second region NN can control boundary of liquid for forming the organic film layer 32, so that the liquid can be trapped in the first region MM to prevent the liquid from overflowing to the second peripheral region NN, thereby ensuring the encapsulation safety and service life of the display panel 100.

Since the second region NN can control liquid boundary of the organic film layer 32 during its molding, it is not required to provide structures such as barrier walls, which can reduce changing width of non-display regions of the display panel 100, and which is beneficial to realize a narrow frame design.

Step S100 it may include:

Plasma-enhanced chemical vapor deposition or magnetron sputtering is used to apply a first inorganic material on the side of an array substrate 10 with a light-emitting layer 20 to form a film body 311. The film body 311 may include at least one of silicon oxide $SiO_x$, silicon oxynitride $Si_xO_yN_z$, and aluminum oxide $Al_xO_y$.

With a mask for covering peripheral regions of the film body 311, the predetermined region of the film body 311, such as the remaining regions that is uncovered by a mask in the embodiment, is subjected to an oxygen plasma treatment for introducing —OH bond, thereby forming an energy regulation layer 312 that is embedded in the film body 311. The energy regulation layer 312 and the film body 311 together form a first inorganic film layer 31a having a first region MM and a second region NN and the energy regulation layer 312 is located in the first region MM.

In step S200, an organic film layer 32 may be molded with ink by inkjet printing. Since the first region MM has a surface energy greater than the second region NN, diffusivity of the ink can be improved, thereby ensuring planarization of the organic film layer 32 so that the molded organic film layer 32 is thinner and lighter, and at the same time, the boundary of the organic film layer 32 can be controlled.

In step S300, a second inorganic film layer 31b can be molded on the organic film layer 32 by means of plasma enhanced chemical vapor deposition or chemical vapor deposition (CVD), the second inorganic film layer 31b covers the organic film layer 32, and the second inorganic film Layer 31b may include silicon nitride $SiN_x$.

It can be understood that the molding method of step S100 is not limited to the above-mentioned manner, and in some embodiments, step S100 may further include:

Plasma-enhanced chemical vapor deposition or magnetron sputtering is used to apply a first inorganic material on the side of an array substrate 10 with a light-emitting layer 20 to form a film body 311. The film body 311 may include at least one of silicon oxide $SiO_x$, silicon oxynitride $Si_xO_yN_z$, and aluminum oxide $Al_xO_y$.

With a mask for covering peripheral regions of the film body 311, at least one of silicon oxide $SiO_x$, silicon oxynitride $Si_xO_yN_z$, and aluminum oxide $Al_xO_y$ is vapor deposited on the predetermined region of the film body 311, such as the remaining regions that is uncovered by a mask in the embodiment, thereby forming an energy regulation layer 312. The energy regulation layer 312 and the film body 311 together form a first inorganic film layer 31a having a first region MM and a second region NN and the energy regulation layer 312 is located in the first region MM. The energy regulation layer 312 has an oxygen content greater than the film body 311, which can also make the surface energy of the first region MM of the molded first inorganic film layer greater than the surface energy of the second region NN. It should be noted that the predetermined region mentioned above may be the region corresponding to the pre-molded organic film layer.

While the application has been described with reference to the preferred embodiments, various modifications may be made and equivalents may be substituted for parts thereof without departing from the scope of the application. In particular, as long as there is no structural conflict, each technical feature mentioned in each embodiment can be combined in any manner. The present application is not limited to the specific embodiments disclosed herein, but includes all technical solutions falling within the scope of the claims.

What is claimed is:

1. A display panel, comprising:
an array substrate;
a light-emitting layer arranged on the array substrate;
an encapsulation layer covering the light-emitting layer, wherein the encapsulation layer comprises at least one inorganic film layer and at least one organic film layer which are stacked and alternately arranged, and the at least one inorganic film layer includes a first region and a second region arranged around the first region, the first region of the at least one inorganic film layer located between the light-emitting layer and the at least one organic film layer has a surface energy greater than the second region, and the at least one organic film layer is stacked over the first region, the at least one inorganic film layer comprises a film body and an energy regulation layer disposed inside the film body, the energy regulation layer is located in the first region, the energy regulation layer has a surface energy greater than the film body, the energy regulation layer is embedded into the film body, a side of the energy regulation layer facing the at least one organic film layer is exposed from the film body, and an oxygen content of a surface of the first region away from the array substrate is greater than an oxygen content of a surface of the second region away from the array substrate.

2. The display panel according to claim 1, wherein the surface of the first region away from the array substrate has a contact angle smaller than the surface of the second region away from the array substrate.

3. The display panel according to claim 2, wherein the contact angle of the surface of the first region away from the array substrate is less than 15°, and the contact angle of the surface of the second region away from the array substrate is greater than 40°.

4. The display panel according to claim 3, wherein the contact angle of the surface of the first region away from the array substrate is less than 10°, and the contact angle of the surface of the second region away from the array substrate is greater than 45°.

5. The display panel according to claim 1, wherein the encapsulation layer includes two inorganic film layers and one organic film layer, the one organic film layer is located between the two inorganic film layers, and the first region of one of the two inorganic film layers located close to the light-emitting layer has a surface energy greater than the second region.

6. The display panel according to claim 1, wherein the encapsulation layer includes more than two inorganic film layers and a plurality of organic film layers; and
the first region of each inorganic film layer disposed near the light-emitting layer has a surface energy greater than the second region.

7. The display panel according to claim 1, wherein the first region of each of the at least one inorganic film layer located between the light-emitting layer and the at least one organic film layer has a surface energy greater than the second region.

8. The display panel according to claim 1, wherein the energy regulation layer has a thickness less than or equal to the film body.

9. The display panel according to claim 1, wherein the energy regulation layer has a thickness of 1 nm to 200 nm.

10. The display panel according to claim 9, wherein the energy regulation layer has a thickness of 1 nm to 100 nm.

11. The display panel according to claim 10, wherein the energy regulation layer has a thickness of 1 nm to 20 nm.

12. The display panel according to claim 1, wherein the energy regulation layer comprises at least one of SiOx, SixOyNz and AlxOy and an oxygen content of the energy regulation layer is greater than an oxygen content of the film body.

13. The display panel according to claim 1, wherein the array substrate comprises a plurality of pixel circuits distributed in an array, and the plurality of pixel circuits comprises 2T1C circuits, 3T1C circuits, 7T1C circuits, 9T1C circuits, or 11T1C circuits.

14. The display panel according to claim 13, wherein the light-emitting layer comprises a plurality of sub-pixels distributed in an array, and each pixel circuit of the plurality of pixel circuits is connected to at least one sub-pixel of the plurality of sub-pixels to drive at least one sub-pixel of the plurality of sub-pixels.

15. The display panel according to claim 14, wherein each pixel circuit of the plurality of pixel circuits is connected to two or more sub-pixels of the plurality of sub-pixels emitting the same color to drive two or more sub-pixels of the plurality of sub-pixels having the same color.

16. A display device, comprising the display panel according to claim 1.

17. The display panel according to claim 12, wherein, with a mask for covering peripheral regions of the film body, the predetermined region of the film body is subjected to an oxygen plasma treatment for introducing —OH bond, thereby forming the energy regulation layer that is embedded in the film body.

* * * * *